US009123779B2

(12) United States Patent
Morita

(10) Patent No.: US 9,123,779 B2
(45) Date of Patent: Sep. 1, 2015

(54) SEMICONDUCTOR DEVICE AND PRODUCTION METHOD THEREFOR

(71) Applicant: ROHM CO., LTD., Kyoto (JP)

(72) Inventor: Takeshi Morita, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/291,551

(22) Filed: May 30, 2014

(65) Prior Publication Data

US 2014/0353845 A1 Dec. 4, 2014

(30) Foreign Application Priority Data

Jun. 4, 2013 (JP) ................................ 2013-118146

(51) Int. Cl.
*H01L 23/52* (2006.01)
*H01L 23/48* (2006.01)
*H01L 21/4763* (2006.01)
*H01L 21/768* (2006.01)
*H01L 23/522* (2006.01)

(52) U.S. Cl.
CPC ........ *H01L 21/76819* (2013.01); *H01L 23/522* (2013.01)

(58) Field of Classification Search
CPC ........................ H01L 21/76819; H01L 23/528
USPC ........................... 257/758, 760; 438/622, 624
See application file for complete search history.

(56) References Cited

U.S. PATENT DOCUMENTS

| | | | | |
|---|---|---|---|---|
| 6,261,883 | B1 * | 7/2001 | Koubuchi et al. | 438/197 |
| 7,211,897 | B2 * | 5/2007 | Yamanoue et al. | 257/758 |
| 7,759,798 | B2 * | 7/2010 | Chibahara et al. | 257/758 |
| 2002/0157076 | A1 | 10/2002 | Asakawa | |
| 2004/0184131 | A1 | 9/2004 | Kurashina | |
| 2009/0184424 | A1 | 7/2009 | Furusawa et al. | |
| 2013/0241067 | A1 | 9/2013 | Furusawa et al. | |

FOREIGN PATENT DOCUMENTS

| | | | |
|---|---|---|---|
| JP | 2006-294765 | A | 10/2006 |
| JP | 2013-004565 | A | 1/2013 |

* cited by examiner

*Primary Examiner* — Luan C Thai
(74) *Attorney, Agent, or Firm* — Rabin & Berdo, P.C.

(57) ABSTRACT

A semiconductor device having a multi-level interconnection structure including a plurality of interconnection layers stacked one on another on a semiconductor substrate is provided, and a production method for the semiconductor device. In the production method, forming each of the interconnection layers of the multi-level interconnection structure includes: forming a real interconnection and a dummy interconnection, forming an insulative film covering the real interconnection and the dummy interconnection, and planarizing a surface of the insulative film. The production method may include computing an in-plane distribution of an overall thickness of the multi-level interconnection structure to be expected when no dummy interconnection is formed; and defining a dummy present zone and a dummy absent zone. The dummy interconnection is formed in the defined dummy present zone outside the defined dummy absent zone in each of the interconnection layers.

12 Claims, 16 Drawing Sheets

FIFTH INTERCONNECTION LAYER

FIG. 6A

FIST INTERCONNECTION LAYER

UR

| | | | |
|---|---|---|---|
| 300 | 350 | 380 | 350 |
| 350 | 380 | 410 | 400 |
| 400 | 410 | 500 | 450 |
| 290 | 500 | 520 | 350 |
| 500 | 480 | 460 | 440 |

FIG. 6B

SECOND INTERCONNECTION LAYER

UR

| | | | |
|---|---|---|---|
| 280 | 360 | 380 | 400 |
| 310 | 370 | 410 | 420 |
| 390 | 480 | 400 | 450 |
| 350 | 480 | 390 | 380 |
| 450 | 450 | 470 | 420 |

FIG. 6C

MULTI-LEVEL INTERCONNECTION STRUCTURE

| | | | |
|---|---|---|---|
| 580 | 710 | 760 | 750 |
| 660 | 750 | 820 | 820 |
| 790 | 890 | 900 | 900 |
| 640 | 980 | 910 | 730 |
| 950 | 930 | 930 | 860 |

UR

FIST INTERCONNECTION LAYER

SECOND INTERCONNECTION LAYER

THIRD INTERCONNECTION LAYER

FOURTH INTERCONNECTION LAYER

FIFTH INTERCONNECTION LAYER

FIST INTERCONNECTION LAYER

SECOND INTERCONNECTION LAYER

THIRD INTERCONNECTION LAYER

FOURTH INTERCONNECTION LAYER

FIFTH INTERCONNECTION LAYER

SEMICONDUCTOR DEVICE AND PRODUCTION METHOD THEREFOR

BACKGROUND OF THE INVENTION

1. Field of the Invention

The present invention relates to a semiconductor device including a multi-level interconnection structure provided on a semiconductor substrate, and a production method for the semiconductor device.

2. Description of Related Art

A multi-level interconnection structure provided on a semiconductor substrate includes a plurality of interconnection layers stacked one on another. A method of forming each of the interconnection layers include the steps of: forming an interconnection; burying the interconnection layer with an insulative film; and planarizing a surface of the insulative film by a chemical mechanical polishing (CMP) process.

The CMP planarization step is performed by polishing the surface of the insulative film with a polishing pad being pressed against the surface of the insulative film. A polishing pad pressing pressure is lower in a higher density region in which the interconnection is provided at a higher layout density, and higher in a lower density region in which the interconnection is provided at a lower layout density. Therefore, a so-called global step is formed between the higher density region (dense region) and the lower density region (sparse region). The global step generally reduces the accuracy of a photolithography process to be performed for forming an upper-level interconnection on the surface of the insulative film. In an exposure step, particularly, it is difficult to provide a properly focused state over the entire surface of the insulative film and hence to form a minute interconnection pattern at a higher level of accuracy.

In the prior art disclosed in US2002/157076A1, the entire semiconductor wafer is divided into rectangular regions, and the pattern density is calculated for each of the divided regions. More specifically, the area ratio of an electrically conductive pattern (metal interconnection pattern) to each of the regions is calculated as the pattern density. If the pattern density is not greater than a threshold, the region is defined as the sparse region. In the sparse region, a dummy pattern is provided in addition to the electrically conductive pattern (metal interconnection pattern). With the additional provision of the dummy pattern, the electrically conductive pattern and the dummy pattern are arranged at a uniform layout density as a whole in the sparse region. This reduces the variation in polishing pad pressing pressure, thereby reducing the global step.

In the prior art, the global steps on the respective interconnection layers are reduced. However, it is impossible to completely planarize the surfaces of the respective interconnection layers. With the plurality of interconnection layers stacked one on another, therefore, a larger global step is likely to occur on a surface of an upper interconnection layer.

More specifically, even if the dummy pattern is provided in a sparse region of a first interconnection layer, there is a possibility that the overall layout density of the electrically conductive pattern and the dummy pattern in the sparse region is still lower than the layout density of the electrically conductive pattern in a dense region of the first interconnection layer. In this case, the planarized surface of the insulative film is located at a higher level in the dense region than in the sparse region in which the dummy pattern is provided. On the other hand, it is assumed that a sparse region of a second interconnection layer on the first interconnection layer is located on the dense region of the first interconnection layer.

In this case, a dummy pattern is provided in the sparse region of the second interconnection layer. As a result, there is a possibility that the overall layout density of the electrically conductive pattern and the dummy pattern in the sparse region of the second interconnection layer is higher than the layout density of the electrically conductive pattern of the second interconnection layer on the sparse region of the first interconnection layer. In this case, the insulative film of the second interconnection layer is thicker in the sparse region of the second interconnection layer (on the dense region of the first interconnection layer), and is thinner in a region of the second interconnection layer on the sparse region of the first interconnection layer. Since the thicker insulative film regions of the first interconnection layer and the second interconnection layer are superposed one on the other, the global step on the surface of the second interconnection layer is increased. In the prior art of US2002/157076A1 in which the thicknesses of the respective interconnection layers are made uniform, the global step is increased by stacking the interconnection layers one on another, thereby reducing the accuracy of the photolithography process to be performed on the upper interconnection layer.

SUMMARY OF THE INVENTION

The present invention provides a production method for a semiconductor device having a multi-level interconnection structure including a plurality of interconnection layers stacked one on another on a semiconductor substrate. In the inventive production method, the step of forming each of the interconnection layers of the multi-level interconnection structure includes an interconnection forming step of forming a real interconnection and a dummy interconnection, an insulative film forming step of forming an insulative film covering the real interconnection and the dummy interconnection, and a planarization step of planarizing a surface of the insulative film. The production method includes: a dummy-absent in-plane distribution computing step of computing an in-plane distribution of an overall thickness of the multi-level interconnection structure to be expected when the interconnection layers are each formed by performing the interconnection forming step, the insulative film forming step and the planarization step without forming the dummy interconnection; and a zone defining step of, based on the in-plane distribution of the overall thickness, defining a dummy present zone in which the dummy interconnection is to be provided and a dummy absent zone in which no dummy interconnection is to be provided. In the step of forming each of the interconnection layers, the interconnection forming step includes the step of forming the dummy interconnection in the defined dummy present zone outside the defined dummy absent zone.

Other elements, features, steps, characteristics and advantages of the present invention will become more apparent from the following detailed description of the preferred embodiments with reference to the attached drawings.

BRIEF DESCRIPTION OF THE DRAWINGS

FIGS. 6A, 6B and 6C show simulations of computation of the in-plane distributions of the residual thicknesses of interconnection layers and a simulation of computation of the in-plane distribution of the overall thickness of the multi-level interconnection structure by way of example.

DETAILED DESCRIPTION OF THE PREFERRED EMBODIMENTS

Figure 1:
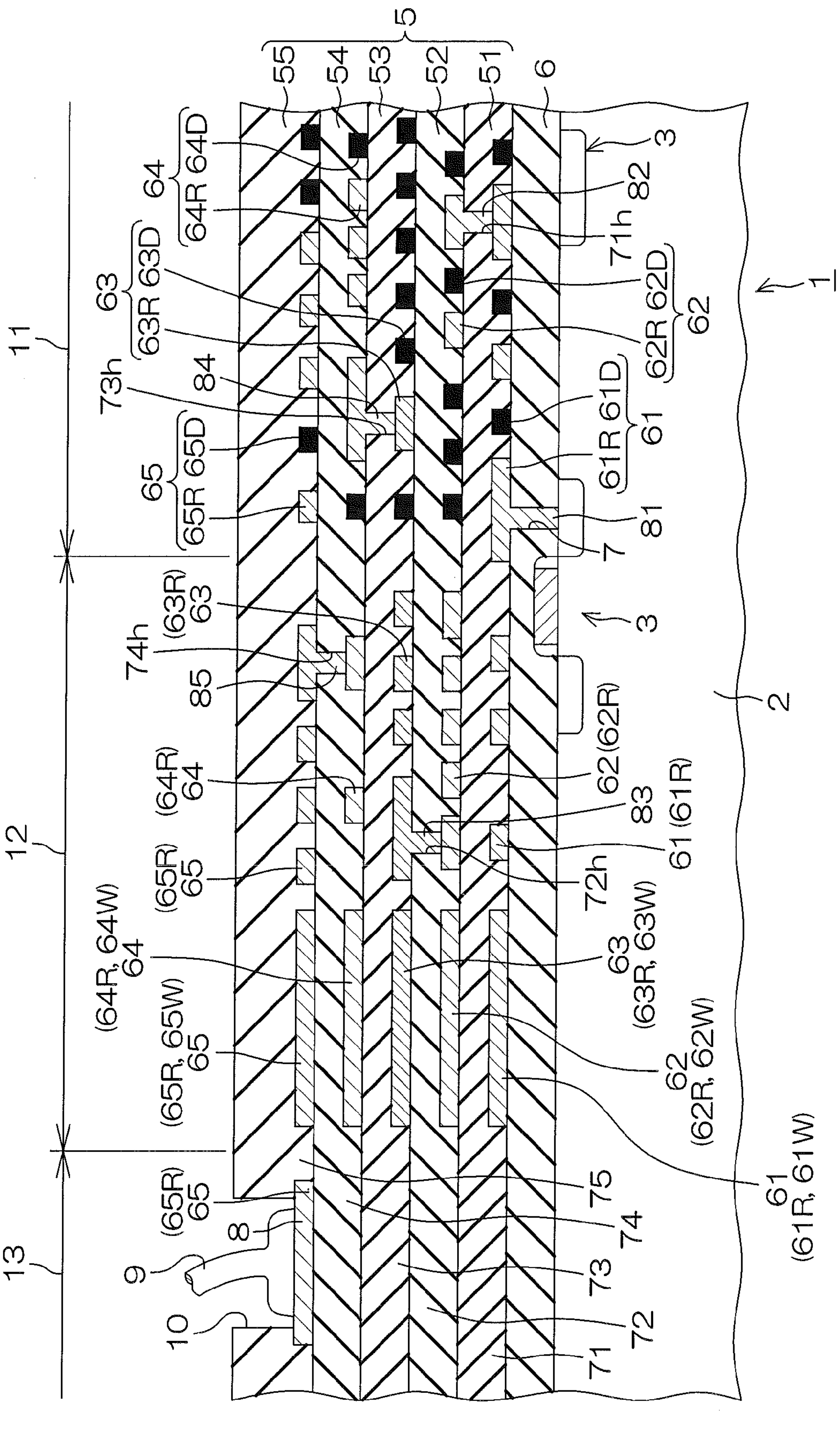
FIG. 1 is a sectional view for explaining an exemplary construction of a semiconductor device according to one embodiment of the present invention.

According to an embodiment of the present invention, there is provided a production method for a semiconductor device having a multi-level interconnection structure including a plurality of interconnection layers stacked one on another on a semiconductor substrate. In the production method, the step of forming each of the interconnection layers of the multi-level interconnection structure includes an interconnection forming step of forming a real interconnection and a dummy interconnection, an insulative film forming step of forming an insulative film covering the real interconnection and the dummy interconnection, and a planarization step of planarizing a surface of the insulative film. The production method includes: a dummy-absent in-plane distribution computing step of computing an in-plane distribution of an overall thickness of the multi-level interconnection structure to be expected when the interconnection layers are each formed by performing the interconnection forming step, the insulative film forming step and the planarization step without forming the dummy interconnection; and a zone defining step of, based on the in-plane distribution of the overall thickness, defining a dummy present zone in which the dummy interconnection is to be provided and a dummy absent zone in which no dummy interconnection is to be provided. In the step of forming each of the interconnection layers, the interconnection forming step includes the step of forming the dummy interconnection in the defined dummy present zone outside the defined dummy absent zone.

The real interconnection is an interconnection contributing to the electrical functions of the semiconductor device, i.e., an interconnection forming a circuit in the semiconductor device. In contrast, the dummy interconnection is an interconnection not contributing to the electrical functions of the semiconductor device, i.e., an interconnection other than the interconnection forming the circuit in the semiconductor device.

In this method, the in-plane distribution of the overall thickness of the multi-level interconnection structure to be expected when the multi-level interconnection structure is formed by stacking the interconnection layers one on another without forming the dummy interconnection is computed. In the actual semiconductor device production process, the step of forming each of the interconnection layers includes the interconnection forming step of forming the real interconnection and the dummy interconnection, the insulative film forming step of forming the insulative film covering the real interconnection and the dummy interconnection, and the planarization step of planarizing the surface of the insulative film. The in-plane distribution of the overall thickness of the multi-level interconnection structure to be expected when the multi-level interconnection structure is formed by performing these steps without forming the dummy interconnection is computed. That is, the in-plane distribution of the overall thickness of the multi-level interconnection structure formed without the provision of the dummy interconnection is computed. The in-plane distribution indicates a global step on the surface of the multi-level interconnection structure to be formed without the provision of the dummy interconnection.

Based on the in-plane distribution thus computed, the dummy present zone in which the dummy interconnection is to be provided, and the dummy absent zone in which no dummy interconnection is to be provided are defined. In the interconnection forming step of forming each of the interconnection layers, the dummy interconnection is provided in the dummy present zone, and no dummy interconnection is provided in the dummy absent zone. That is, the dummy present zone and the dummy absent zone are each defined commonly for the respective interconnection layers of the multi-level interconnection structure, and the dummy interconnection is provided only in the dummy present zone in each of the interconnection layers. In the multi-level interconnection structure according to this embodiment, the dummy interconnection or the real interconnection is provided in the dummy present zone in each of the interconnection layers, and no dummy interconnection is provided in the dummy absent zone in each of the interconnection layers (the real interconnection may be provided or not provided in the dummy absent zone in each of the interconnection layers).

Since the dummy present zone and the dummy absent zone are thus defined based on the distribution of the overall thickness of the multi-level interconnection structure, there is no possibility that the global steps occurring on the respective interconnection layers are accumulated. Therefore, the global step on a surface of an upper one of the interconnection layers of the multi-level interconnection structure can be reduced. In general, a lower one of the interconnection layers of the multi-level interconnection structure has a smaller global step, and an upper one of the interconnection layers of the multi-level interconnection structure has a greater global step. Therefore, if it is possible to reduce the global step on the upper interconnection layer, the global steps on the respective interconnection layers of the multi-level interconnection structure are consequently reduced. This makes it possible to accurately perform the photolithography process on each of the interconnection layers.

The dummy interconnection may be a dummy interconnection pattern including a plurality of pattern elements each having a predetermined shape and a predetermined size and regularly arranged. The pattern elements may be arranged at a predetermined interval. More specifically, the pattern elements may be arranged at predetermined intervals in two crossing directions (e.g., in two directions orthogonal to each other). The intervals in the two directions may be the same or different.

The planarization step may include a polishing step of polishing the surface of the insulative film with a polishing pad in press contact with the surface of the insulative film. An exemplary polishing process for the polishing step is a chemical mechanical polishing process. The planarization step may include an etching-back step rather than the polishing step.

According to another embodiment of the present invention, the zone defining step includes the step of defining the dummy present zone and the dummy absent zone by applying a threshold to the in-plane distribution of the overall thickness computed in the dummy-absent in-plane distribution computing step.

In this method, the threshold is applied to the result of the computation of the in-plane distribution without the provision of the dummy interconnection to define the dummy present zone and the dummy absent zone. Therefore, the dummy present zone in which the dummy interconnection is to be provided can be defined by a simple method.

According to further another embodiment of the present invention, the zone defining step includes: a multi-threshold zone set defining step of applying a plurality of different thresholds to the in-plane distribution of the overall thickness computed in the dummy-absent in-plane distribution computing step to define plural sets of the dummy present zone and the dummy absent zone for the respective thresholds; a dummy-present in-plane distribution computing step of, for the respective sets of the dummy present zone and the dummy absent zone, computing in-plane distributions of the overall thickness of the multi-level interconnection structure to be expected when the interconnection layers are each formed by performing the interconnection forming step, the insulative film forming step and the planarization step with the dummy interconnection provided in the dummy present zone outside the dummy absent zone; and a zone set selecting step of selecting one of the plural sets of the dummy present zone and the dummy absent zone by evaluating the in-plane distributions for the respective sets of the dummy present zone and the dummy absent zone.

In this method, the plurality of thresholds are applied to the result of the computation of the in-plane distribution without the provision of the dummy interconnection. Accordingly, the plural sets of the dummy present zone and the dummy absent zone are defined for the respective thresholds. For each of the plural sets of the dummy present zone and the dummy absent zone, the in-plane distribution of the overall thickness of the multi-level interconnection structure to be expected with the dummy interconnection provided in the dummy present zone outside the dummy absent zone is computed. The in-plane distributions thus computed for the respective sets of the dummy present zone and the dummy absent zone are evaluated, and one of the plural sets of the dummy present zone and the dummy absent zone is selected. In other words, the optimum threshold is found based on the evaluation of the in-plane distributions. This makes it possible to properly define the dummy present zone and the dummy absent zone to further reduce the global step on the upper interconnection layer of the multi-level interconnection structure.

More specifically, the evaluation of the in-plane distributions is preferably such that the in-plane distribution is rated highly when the global step on the surface of the multi-level interconnection structure (the variation in in-plane distribution) is smaller.

According to still another embodiment of the present invention, the dummy-absent in-plane distribution computing step includes the step of computing overall thicknesses of the multi-level interconnection structure on a plurality of unit regions defined as each having a predetermined shape and a predetermined size by dividing a major surface region of the semiconductor substrate.

In this method, the overall thicknesses of the multi-level interconnection structure on the respective unit regions of the semiconductor substrate defined as each having the predetermined shape and the predetermined size by dividing the major surface region of the semiconductor substrate are each determined. Since the in-plane distribution of the overall thickness of the multi-level interconnection structure can be properly computed based on the overall thicknesses thus determined, the dummy present zone and the dummy absent zone can be properly defined based on the in-plane distribution and, therefore, the global step can be effectively reduced.

Similarly, the dummy-present in-plane distribution computing step includes the step of computing overall thicknesses of the multi-level interconnection structure on a plurality of unit regions defined as each having a predetermined shape and a predetermined size by dividing the major surface region of the semiconductor substrate. In this case, the unit regions may be defined in the same manner as in the dummy-absent in-plane distribution computing step or in a different manner.

According to further another embodiment of the present invention, there is provided a semiconductor device which includes a semiconductor substrate and a multi-level interconnection structure provided on the semiconductor substrate, wherein the multi-level interconnection structure includes a plurality of interconnection layers stacked one on another and each including a real interconnection and a dummy interconnection covered with an insulative film, wherein the dummy interconnection is provided in a dummy present zone defined commonly for the respective interconnection layers outside a dummy absent zone defined commonly for the respective interconnection layers.

This semiconductor device can be produced by the aforementioned production method. Therefore, the semiconductor device can be provided, which has a construction effective to minimize the global step on an upper interconnection layer of the multi-level interconnection structure.

According to still another embodiment of the present invention, the real interconnection is provided at a higher density in a part of the dummy present zone than in a part of the dummy absent zone in at least one of the interconnection layers.

Since the layout of the dummy present zone and the dummy absent zone is common for all the interconnection layers, the density of the real interconnection is not correlated with the presence/absence of the dummy interconnection in each of the interconnection layers. That is, the dummy present zone may include a region in which the real interconnection is provided at substantially the same density as in a part of the dummy absent zone and/or a region in which the real interconnection is provided at a higher density than in a part of the dummy absent zone. In other words, some interconnection layer may have a region in which no dummy interconnection is provided even if the density of the real interconnection is lower. Where the multi-level interconnection structure includes such an interconnection layer, the global step on the overall multi-level interconnection structure is effectively reduced.

According to further another embodiment of the present invention, the density of the real interconnection is lower in the dummy present zone than in the dummy absent zone in the overall multi-level interconnection structure including the plurality of interconnection layers.

Where the dummy present zone and the dummy absent zone are defined based on the evaluation of the in-plane distributions of the overall thickness of the multi-level interconnection structure, the density of the real interconnection in the overall multi-level interconnection structure is generally lower in the dummy present zone and higher in the dummy absent zone. Therefore, the semiconductor device can be provided, which is configured such that the density of the real interconnection is relatively low in the dummy present zone to effectively reduce the global step.

With reference to the attached drawings, embodiments of the present invention will hereinafter be described in greater detail.

FIG. 1 is a sectional view for explaining an exemplary construction of a semiconductor device according to one embodiment of the present invention. The semiconductor device 1 includes a semiconductor substrate 2, an element 3 provided in a surface portion of the semiconductor substrate 2, and a multi-level interconnection structure 5 provided on a surface of the semiconductor substrate 2. The element 3 may be an active element such as a transistor, or a passive element such as a diffusion resistor element.

The multi-level interconnection structure 5 includes a plurality of interconnection layers 51 to 55. The interconnection layers 51 to 55 each include an interconnection 61 to 65, and an insulative film 71 to 75 covering the interconnection 61 to 65. The interconnection 61 to 65 includes a real interconnection 61R to 65R and a dummy interconnection 61D to 65D (with its section shown in solid black in FIG. 1 for discrimination from the real interconnection). The real interconnections 61R to 65R of the respective interconnection layers 51 to 55 are electrically connected to the element 3 to form a circuit in the semiconductor device 1, thereby contributing to the electrical functions of the semiconductor device 1. In contrast, the dummy interconnections 61D to 65D of the respective interconnection layers 51 to 55 are not electrically connected to the element 3 and do not form the circuit in the semiconductor device 1. Therefore, the dummy interconnections 61D to 65D do not substantially contribute to the electrical functions of the semiconductor device 1. The insulative films 71 to 74 of the first to fourth interconnection layers 51 to 54 each have a via-hole 71*h* to 74*h* for electrical connection to the real interconnection 62R to 65R of the upper interconnection layer 52 to 55. Vias 82 to 85 are respectively provided integrally with the real interconnections 62R to 65R in the via-holes 71*h* to 74*h*. These vias 82 to 85 are respectively connected to the lower real interconnections 61R to 64R.

In this embodiment, the multi-level interconnection structure 5 includes a first interconnection layer 51, a second interconnection layer 52, a third interconnection layer 53, a fourth interconnection layer 54 and a fifth interconnection layer 55. The lowermost first interconnection layer 51 is provided on an inter-level insulative film 6 covering the element 3 provided in the surface portion of the semiconductor substrate 2. The interlevel insulative film 6 has a contact hole 7. The real interconnection 61R of the first interconnection layer 51 is connected to the element 3 via a via 81 provided in the contact hole 7. The uppermost fifth interconnection layer 55 includes a plurality of bonding pads 8 provided in an outer peripheral portion thereof for connection to an external device. The insulative film 75 of the fifth interconnection layer 55 has openings 10 through which the bonding pads 8 are exposed. Bonding wires 9 are respectively connected to the bonding pads 8 through the openings 10, and the semiconductor device 1 is electrically connected to an external circuit via the bonding wires 9. Of course, the external connection may be achieved with the use of bumps connected to the bonding pads rather than by the bonding wires.

The dummy interconnections 61D to 65D are respectively provided in the interconnection layers 51 to 55 for reduction of a global step on the multi-level interconnection structure 5. In the semiconductor device 1 of this embodiment, a dummy present zone 11 and a dummy absent zone 12 are each defined commonly for the first to fifth interconnection layers 51 to 55. The dummy interconnections 61D to 65D are provided in the dummy present zone 11 outside the dummy absent zone 12. That is, the dummy interconnections 61D to 65D are respectively provided in the first to fifth interconnection layers 51 to 55 only in the dummy present zone 11. A region of the semiconductor device 1 in which the bonding pads 8 are provided is defined as a prohibited zone 13 in which the provision of the dummy interconnections is prohibited.

The layout of the dummy present zone 11 and the dummy absent zone 12 is correlated with the layout density of the real interconnections 61R to 65R arranged in the overall multi-level interconnection structure 5 as seen in plan. More specifically, a region in which the real interconnections 61R to 65R are arranged at a lower layout density in the overall multi-level interconnection structure 5 as seen in plan is defined as the dummy present zone 11 and, conversely, a region in which the real interconnections 61R to 65R are arranged at a higher layout density in the overall multi-level interconnection structure 5 as seen in plan is defined as the dummy absent zone 12.

In some interconnection layer (e.g., in the fourth interconnection layer 54), therefore, the density of the real interconnection (64R) may be higher in the dummy present zone 11 than in the dummy absent zone 12. In some interconnection layer (e.g., in the first and fifth interconnection layers 51, 55), the density of the real interconnection (61R, 65R) in the dummy present zone 11 may be substantially equal to the density of the real interconnection (61R, 65R) in the dummy absent zone 12. In some interconnection layer (e.g., in the second and third interconnection layers 52, 53), the density of the real interconnection (62R, 63R) may be lower in the dummy present zone 11 than in the dummy absent zone 12. That is, the layout of the dummy present zone 11 and the dummy absent zone 12 is not correlated with the layout densities of the real interconnections 61R to 65R in the respective interconnection layers 51 to 55.

In the respective interconnection layers 51 to 55, the real interconnections 61R to 65R and the dummy interconnections 61D to 65D are formed of the same material (more specifically, a metal material such as aluminum). Therefore, the real interconnection 61R to 65R and the dummy interconnection 61D to 65D are simultaneously formed in an interconnection forming step of forming the interconnection in each of the interconnection layers.

FIGS. 2A to 2D are sectional views for explaining a production process for the semiconductor device 1, mainly showing a production process for the multi-level interconnection structure 5.

Figure 2A:
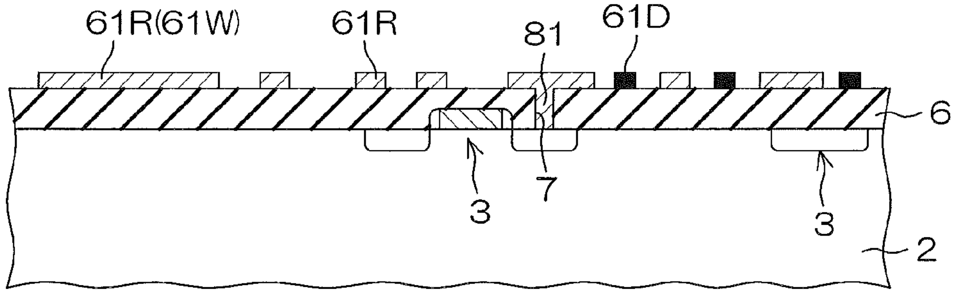
FIGS. 2A to 2D are sectional views for explaining an exemplary production process for the semiconductor device, mainly showing a multi-level interconnection structure production process.

As shown in FIG. 2A, the real interconnection 61R and the dummy interconnection 61D for the first interconnection layer 51 are simultaneously formed in a pattern on the inter-level insulative film 6 covering the element 3 by a photolithography process (interconnection forming step). A part of the real interconnection 61R enters the contact-hole 7 formed in the inter-level insulative film 6 to form the via 81 for connection to the element 3. The dummy interconnection 61D is spaced a predetermined distance from the real interconnection 61R. Where plural pieces of dummy interconnections 61D are provided, a minimum distance between adjacent dummy interconnection pieces 61D is kept at a predetermined distance. The distance between the real interconnection 61R and the dummy interconnection 61D is preferably minimized such that an interconnect capacitance occurring between the real interconnection 61R and the dummy interconnection 61D is negligible. The minimum distance between the dummy interconnection pieces 61D is preferably minimized such that an interconnect capacitance occurring between the dummy interconnection pieces 61D is negligible.

The photolithography process includes the steps of forming an interconnection material film on the entire surface of an underlying layer, forming a photoresist mask on the interconnection material film, and patterning the interconnection material film by etching the interconnection material film with the use of the photoresist mask to simultaneously form the real interconnection and the dummy interconnection. The interconnection material film forming step may be the step of sputtering an interconnection metal material such as aluminum. The photoresist mask forming step includes the steps of forming a photoresist film on the entire surface of the interconnection material film, exposing the photoresist film to light by using a photomask on which a pattern of the real interconnection and the dummy interconnection are drawn, and developing the exposed photoresist mask to form openings corresponding to the pattern of the real interconnection and the dummy interconnection in the photoresist film. The etching of the interconnection material film may be dry etching such as anisotropic ion etching.

Figure 2B:
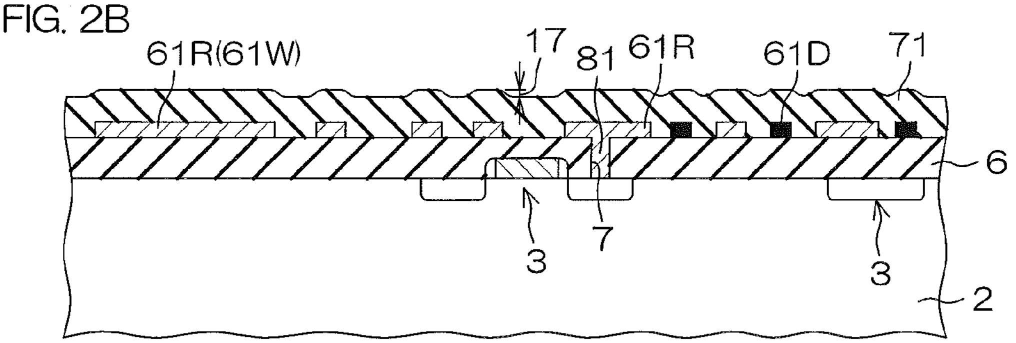

Next, as shown in FIG. 2B, the insulative film 71 is formed as covering the real interconnection 61R and the dummy interconnection 61D (insulative film forming step). The insulative film 71 may be, for example, a silicon oxide film, which may be formed by a plasma CVD (chemical vapor deposition) method or a high density plasma CVD method.

Figure 2C:
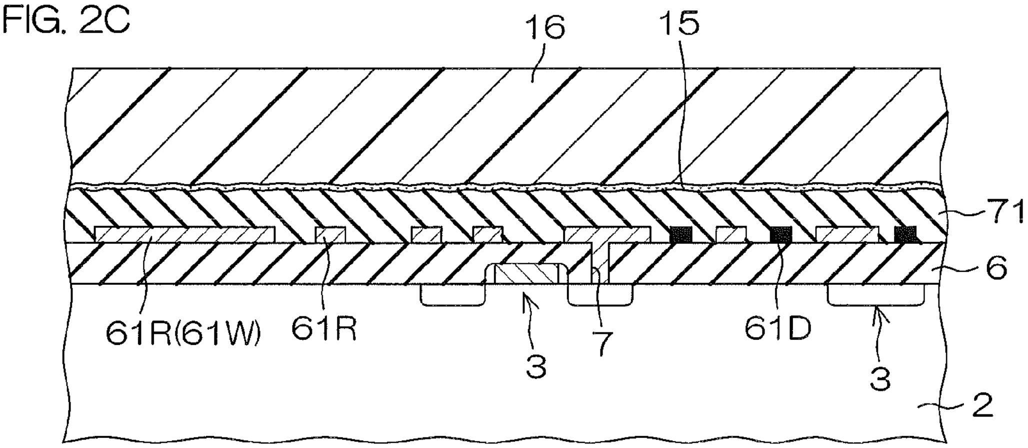

In turn, as shown in FIG. 2C, a planarization step is performed for planarizing the surface of the insulative film 71. The planarization step may be performed by a chemical mechanical polishing (CMP) method. In the CMP method, a polishing pad 16 is pressed against the surface of the insulative film 71 while a slurry 15 containing an abrasive is supplied to the surface of the insulative film 71. In this state, the polishing pad 16 and the insulative film 71 (more specifically, the semiconductor substrate 2) are moved relative to each other. Thus, the surface of the insulative film 71 is physically polished via the slurry 15 by the polishing pad 16. The surface of the insulative film 71 is further polished by the chemical action of a chemical agent contained in the slurry 15. As a result, steps (undulations) on the surface of the insulative film 71 (see FIG. 2B) are reduced, so that the surface of the insulative film 71 is planarized. As shown in FIG. 2B, surface portions of the insulative film 71 above the interconnection 61 (61R, 61D) are protruded, and surface portions of the insulative film 71 under which no interconnection 61 (61R, 61D) is formed are depressed. Thus, the insulative film 71 has relatively large steps 17 on its surface immediately after the formation thereof. These steps 17 are reduced in the planarization step.

In the planarization step employing the CMP method, the pressing force of the polishing pad 16 is distributed over a higher interconnection density region, so that a pressure applied to the surface of the insulative film 71 by the polishing pad 16 is lower and the polishing rate is correspondingly lower. In a lower interconnection density region, conversely, the pressing force of the polishing pad 16 is concentrated on a smaller number of protruded surface portions of the insulative film 71, so that the pressure applied to the surface of the insulative film 71 by the polishing pad 16 is higher and the polishing rate is correspondingly higher. Therefore, the thickness (residual thickness) of the insulative film 71 after the planarization step is greater in the higher interconnection density region, and smaller in the lower interconnection density region.

Figure 2D:
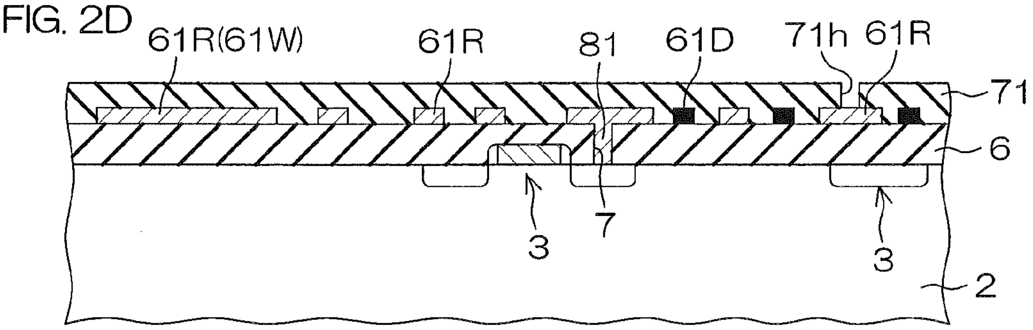

After the planarization step, as shown in FIG. 2D, the via-hole 71*h* is formed in the insulative film 71. The via-hole 71*h* is a through-hole in which the via 82 (see FIG. 1) is provided for connecting the real interconnection 61R of the interconnection layer 51 to the real interconnection 62R of the upper interconnection layer 52. Therefore, the via-hole 71*h* is located at a position at which the real interconnection 61R can be partly exposed. The real interconnection 62R of the upper interconnection layer 52 enters the via-hole 71*h* to form the via 82.

The formation of the via-hole 71*h* is achieved by a photolithography process. More specifically, a photoresist film is formed on the planarized surface of the insulative film 71, and exposed to light by using a photomask having a pattern of the via-hole 71*h*. Then, the exposed photoresist film is developed, whereby a resist mask is formed. The via-hole 71*h* can be formed by etching (dry-etching) the insulative film 71 with the use of this resist mask.

These process steps are repeatedly performed according to the interconnection patterns of the respective interconnection layers 51 to 55 (each including both the real interconnection and the dummy interconnection), whereby the multi-level interconnection structure 5 having the plurality of interconnection layers 51 to 55 is formed.

Figure 3A:
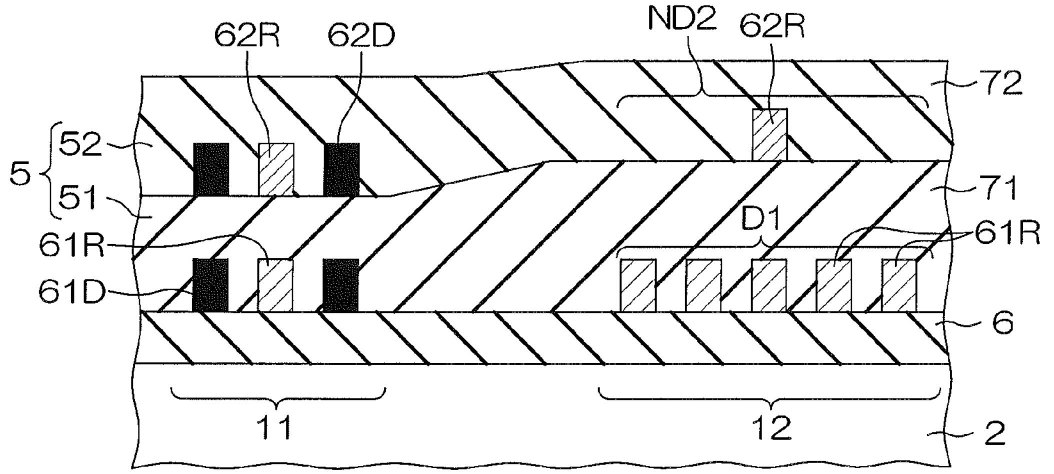
FIG. 3A is a schematic sectional view for explaining an exemplary dummy interconnection layout according to the embodiment of the present invention.
Figure 3B:
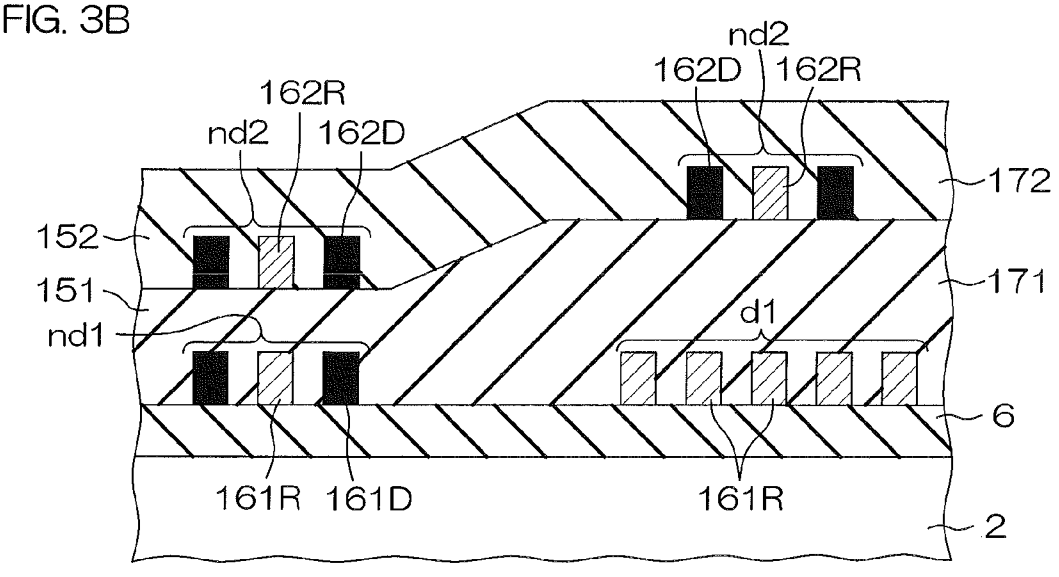
FIG. 3B is a schematic sectional view for explaining a dummy interconnection layout according to a comparative example.

FIG. 3A is a schematic sectional view for explaining a dummy interconnection layout according to the embodiment of the present invention. FIG. 3B is a schematic sectional view for explaining a dummy interconnection layout according to a comparative example.

In the comparative example shown in FIG. 3B, the layouts of the dummy interconnections 161D, 162D in the respective interconnection layers 151, 152 are determined according to the layout densities of the real interconnections 161R, 162R in the respective interconnection layers 151, 152. More specifically, the dummy interconnection 161D is additionally provided in a sparse region nd1 of the first interconnection layer 151 in which the real interconnection 161R is provided at a lower layout density. In the second interconnection layer 152 provided on the first interconnection layer 151, similarly, the dummy interconnection 162D is additionally provided in a sparse region nd2 in which the real interconnection 162R is provided at a lower layout density. In this example, the sparse region nd2 of the second interconnection layer 152 is located on a dense region d1 of the first interconnection layer 151 in which the real interconnection 161R is provided at a higher layout density. Therefore, the dummy interconnection 162D is additionally provided in a region of the second interconnection layer 152 on the dense region d1 of the first interconnection layer 151. It is noted that reference characters 171, 172 respectively designate insulative films of the first interconnection layer 151 and the second interconnection layer 152.

In the embodiment shown in FIG. 3A, in contrast, the dummy present zone 11 and the dummy absent zone 12 are defined according to the real interconnection density of the overall multi-level interconnection structure 5. More specifically, a region of the multi-level interconnection structure 5 in which the real interconnection density is lower as seen in plan is defined as the dummy present zone 11, and a region of the multi-level interconnection structure 5 in which the real interconnection density is higher as seen in plan is defined as the dummy absent zone 12. The dummy interconnections 61D, 62D are respectively additionally provided in the interconnection layers 51, 52 in the dummy present zone 11, and no dummy interconnections are provided in the interconnection layers 51, 52 in the dummy absent zone 12. Therefore, there is a possibility that the dummy interconnection 62D is not additionally provided in a region of the second interconnection layer 52 located on the dense region D1 of the first interconnection layer 51 in which the real interconnection 61R is provided at a higher layout density even if that region is a sparse region ND2 in which the real interconnection 62R is provided at a lower layout density.

In the comparative example shown in FIG. 3B, the layouts of the dummy interconnections 161D, 162D are respectively determined for the interconnection layers 151, 152 according to the densities of the real interconnections 161R, 162R in the respective interconnection layers 151, 152. Therefore, there is a possibility that a greater global step occurs when the interconnection layers are stacked one on another. Where the layout of the dummy interconnection is determined based on the real interconnection density of the overall multi-level interconnection structure 5 as in the embodiment of FIG. 3A, in contrast, the global step on the upper interconnection layer is not significantly increased by stacking the plurality of interconnection layers.

In general, the global step is not so great on a lower interconnection layer of the multi-level interconnection structure, but tends to be greater on an upper interconnection layer of the multi-level interconnection structure. Therefore, the layout of the dummy interconnections is determined so as to reduce the global step on the upper interconnection layer, whereby the global steps on the respective interconnection layers of the multi-level interconnection structure can be reduced to an appropriate range.

In the arrangement shown in FIG. 1, more specifically, the exposing step of the photolithography process for the formation of the via-hole 74*h* for the via 85 (top via) below the uppermost fifth interconnection layer 55 is performed under the severest conditions with the smallest process margin. That is, there is the greatest global step, making it difficult to perform the exposing step in a properly focused state over the entire surface of the photoresist film. This makes it difficult to highly accurately form the resist pattern. Therefore, if the global step on the surface of the insulative film of the uppermost interconnection layer (fifth interconnection layer 55) can be reduced, the photolithography process can be accurately performed on all the interconnection layers. Thus, the production process is highly reliable.

Figure 4:
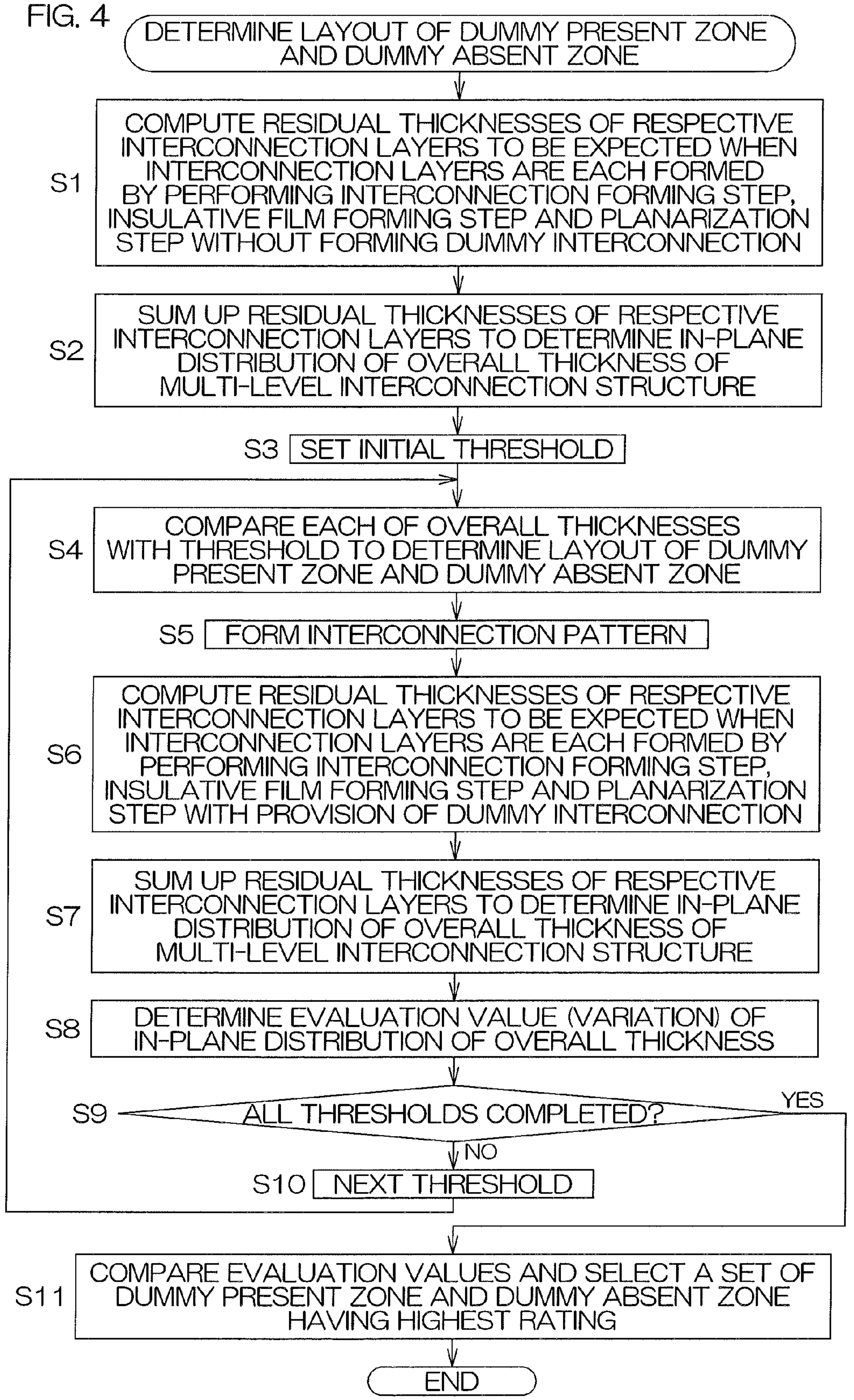
FIG. 4 is a flowchart for explaining how to determine the layout of a dummy present zone and a dummy absent zone by way of example.

FIG. 4 is a flowchart for explaining how to determine the layout of the dummy present zone and the dummy absent zone. The process steps shown in this flow chart may be performed manually or by a computer. That is, some or all of the process steps may be performed manually, or some or all of the process steps may be performed automatically by the computer. Where the computer performs the respective process steps, it is merely necessary to prepare a computer program for the process steps, and cause the computer to perform the computer program.

More specifically, the thicknesses of the respective interconnection layers to be expected when the interconnection layers are formed without the provision of the dummy interconnection in any of the interconnection layers are computed (Step S1). More specifically, it is assumed that the interconnection layers are each formed by sequentially performing an interconnection forming step of forming the real interconnection without forming the dummy interconnection, an insulative film forming step of covering the real interconnection, and a planarization step (e.g., a CMP step). According to this assumption, the thickness (residual thickness) of each of the interconnection layers to be left after the planarization step is computed by simulation (typically, computer simulation).

Figure 5:
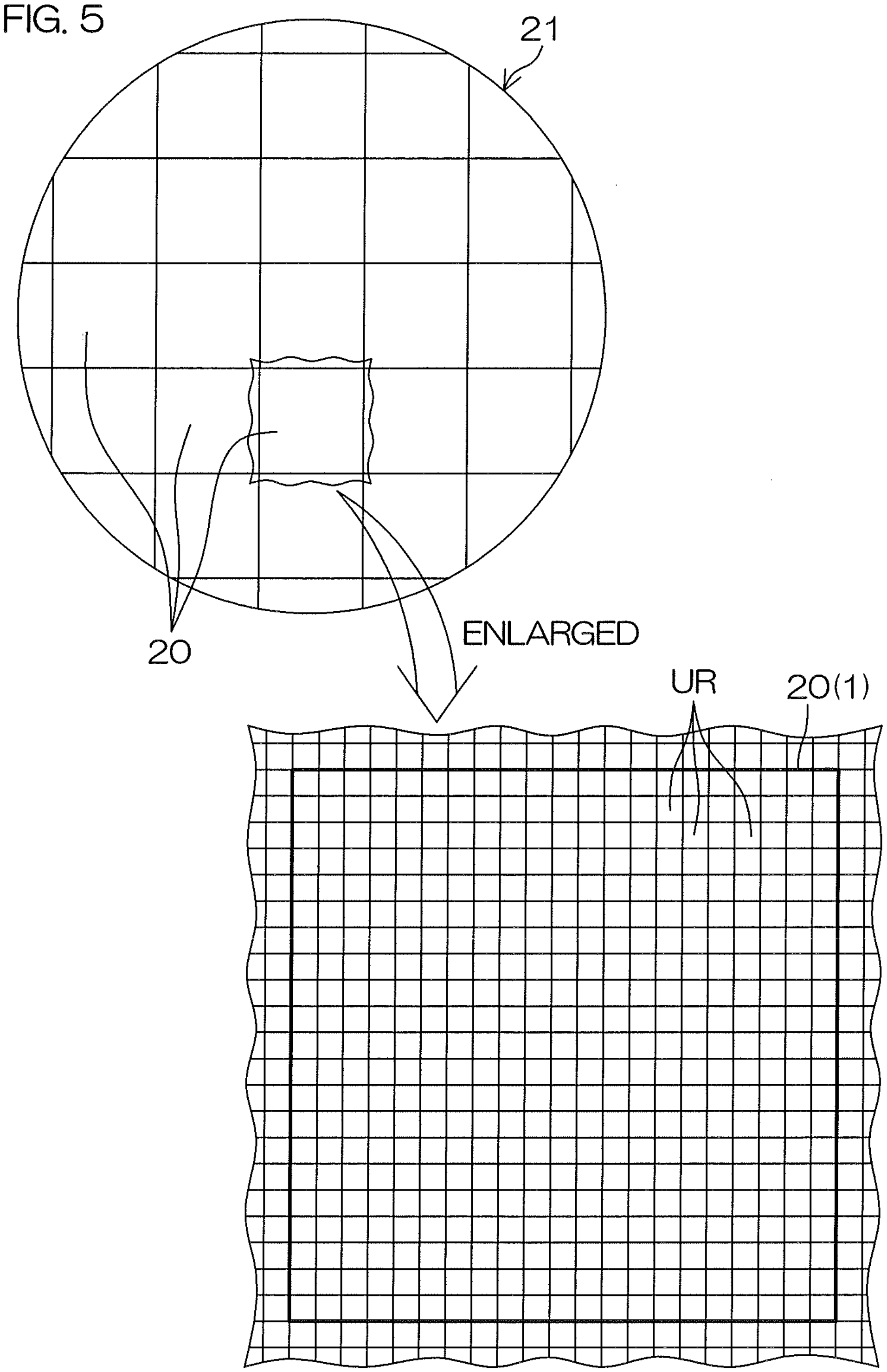
FIG. 5 is a schematic plan view for explaining exemplary unit regions to be used for determining the in-plane distribution of the thickness (residual thickness) of an interconnection layer after the planarization step.
Figure 7A:
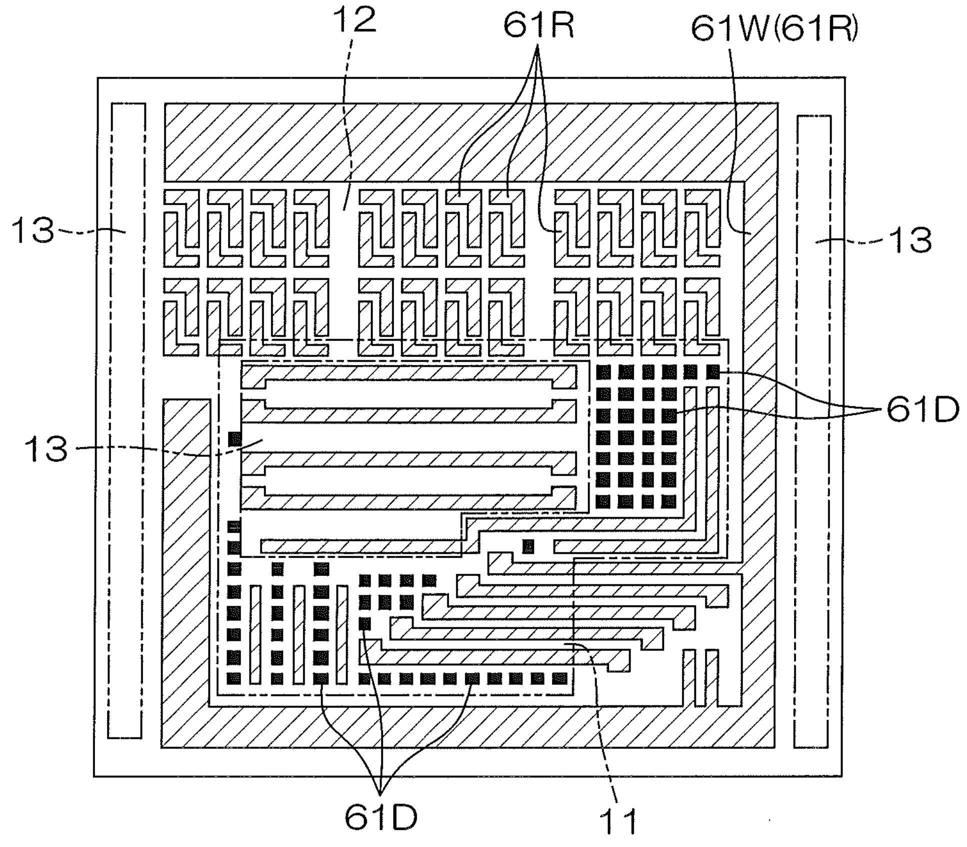
FIG. 7A is a plan view showing an exemplary interconnection pattern of a first interconnection layer of the multi-level interconnection structure.
Figure 7B:
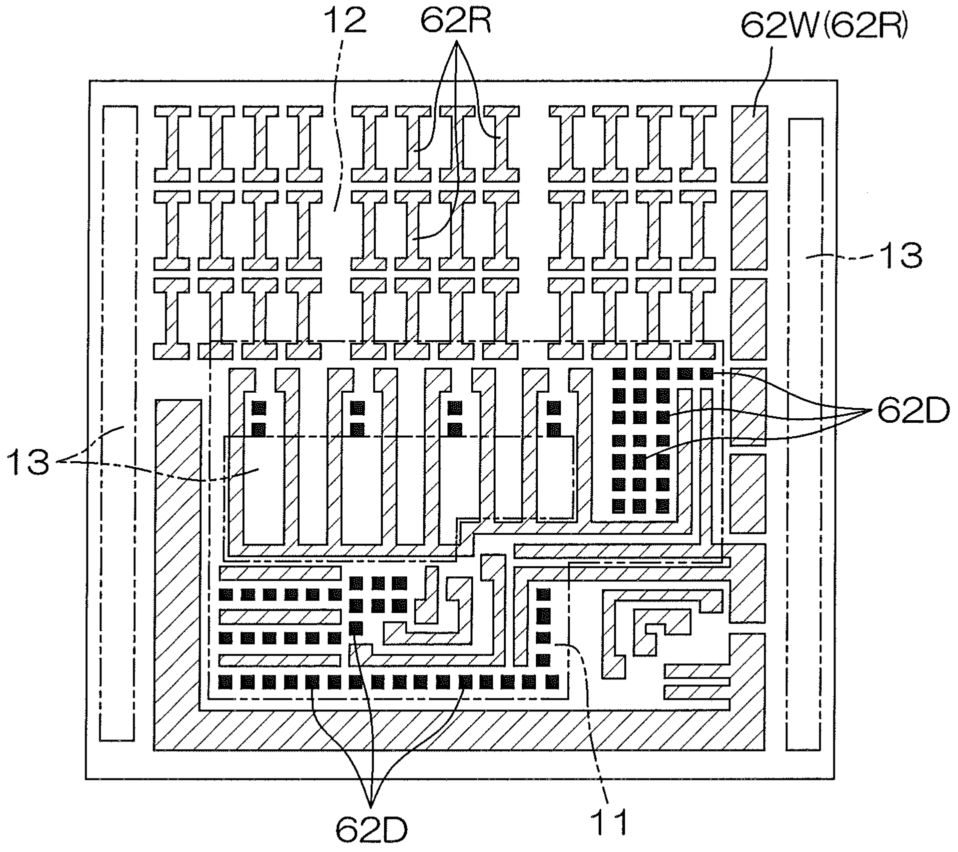
FIG. 7B is a plan view showing an exemplary interconnection pattern of a second interconnection layer of the multi-level interconnection structure.
Figure 7C:
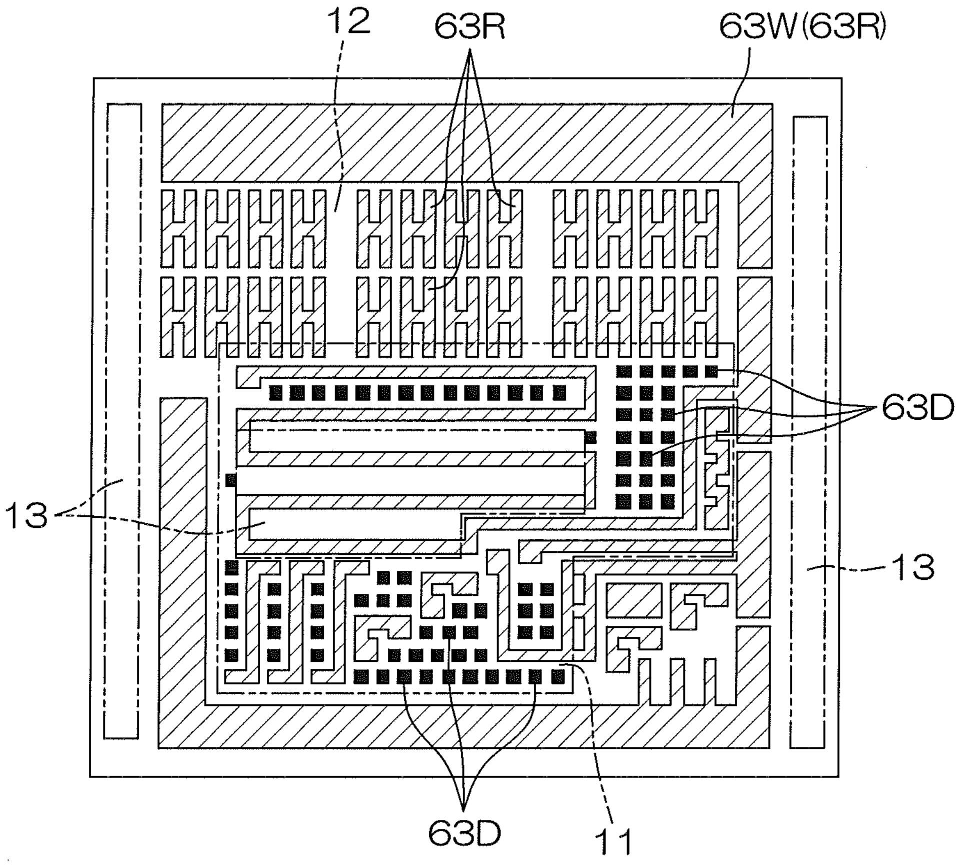
FIG. 7C is a plan view showing an exemplary interconnection pattern of a third interconnection layer of the multi-level interconnection structure.
Figure 7D:
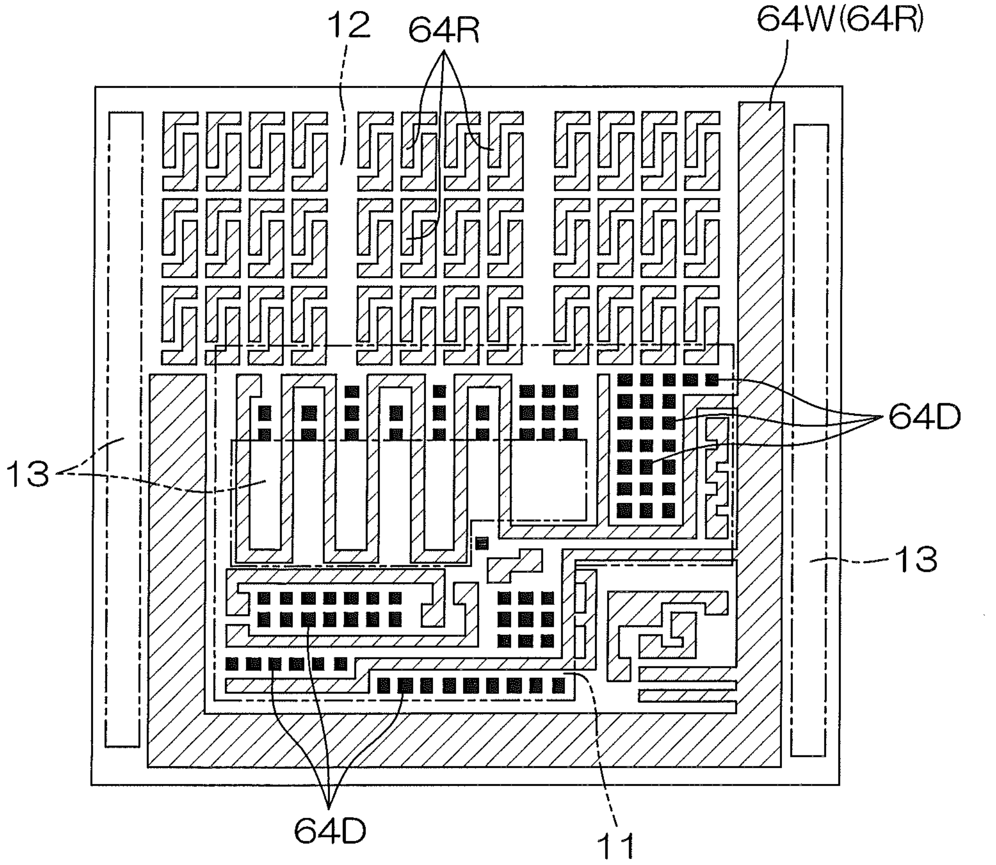
FIG. 7D is a plan view showing an exemplary interconnection pattern of a fourth interconnection layer of the multi-level interconnection structure.
Figure 7E:
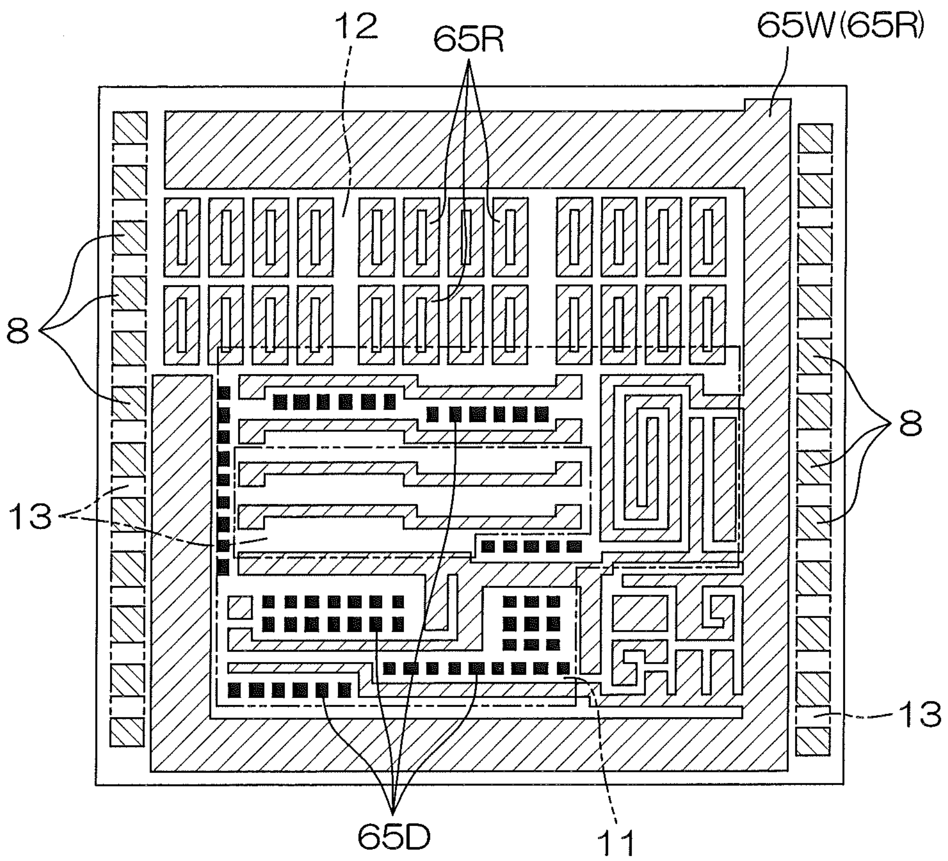
FIG. 7E is a plan view showing an exemplary interconnection pattern of a fifth interconnection layer of the multi-level interconnection structure.

The computation of the residual thickness is performed for each of plural unit regions UR defined as each having a predetermined shape and a predetermined size by dividing the entire surface region of the semiconductor device 1 as seen in plan. More specifically, as shown in FIG. 5, the entire surface region of the semiconductor device 1 is, for example, rectangular as seen in plan. This entire surface region is divided in a lattice form, whereby the unit regions UR (mesh regions) each having the predetermined shape and the predetermined size can be provided. The residual thickness is computed for each of the unit regions UR. Thus, an in-plane distribution of the residual thickness of each of the interconnection layers can be provided.

In the production process for the semiconductor device 1, the interconnection forming step, the insulative film forming step, the planarization step and the like are performed on a semiconductor wafer 21 which includes a plurality of individual device regions 20 for a plurality of semiconductor devices 1. The computation of the residual thickness is performed for each of the unit regions UR constituting each of the individual device regions 20. That is, the residual thicknesses are computed for all the unit regions UR of all the individual device regions 20. The in-plane distribution of the residual thickness may be computed only for some of the individual device regions 20 on the semiconductor wafer 21. Since conditions for each of the process steps may vary depending on the position of the individual device region 20 in the semiconductor wafer 21 (e.g., a distance from the center of the semiconductor wafer 21), it is preferred to compute the in-plane distribution of the residual thickness for each of the unit regions UR of all the individual device regions 20. Similarly, the residual thicknesses may be computed only for some of the unit regions UR in the individual device region 20, but it is more preferred to compute the residual thicknesses for all the unit regions UR.

Then, the residual thicknesses of associated unit regions UR (unit regions superposed one on another in a layer stacking direction) in the respective interconnection layers 51 to 55 are summed up. Thus, the overall thickness of the multi-level interconnection structure 5 is determined for each of the unit regions UR (Step S2 in FIG. 4). The computation is performed for all the unit regions, whereby the in-plane distribution of the overall thickness of the multi-level interconnection structure 5 is determined.

In turn, a threshold for evaluation of the overall thicknesses of the respective unit regions UR is set at a predetermined initial threshold (Step S3).

Then, the overall thickness for each of the unit regions UR is compared with the threshold thus set (Step S4). As the result of the comparison, a unit region UR having an overall thickness not greater than the threshold is defined as the dummy present zone, and a unit region UR having an overall thickness greater than the threshold is defined as the dummy absent zone. If a plurality of unit regions UR defined as the dummy present zones are located in adjacent relation (in consecutive relation), these consecutive unit regions UR form a dummy present zone. If a plurality of unit regions UR defined as the dummy absent zones are located in adjacent relation (in consecutive relation), these consecutive unit regions UR form a dummy absent zone.

Next, an interconnection pattern (an interconnection pattern including the real interconnection and the dummy interconnection) is formed such that the dummy interconnection is located in the dummy present zone outside the dummy absent zone thus defined (Step S5). A predetermined dummy interconnection pattern may be such that pattern elements each having a predetermined shape (e.g., a rectangular shape (square or oblong rectangular shape)) are arranged at a predetermined interval in a matrix array in the entire region of each of the interconnection layers. Pattern elements in a prohibited zone predefined for the interconnection layer, a dummy interconnection absent zone defined for the interconnection layer and a real interconnection present zone defined for the interconnection layer are eliminated from the predetermined dummy interconnection pattern. Thus, a dummy interconnection pattern is provided for the interconnection layer. The dummy interconnection pattern and the real interconnection pattern are superposed one on the other to form the interconnection pattern for the interconnection layer. This process is performed for each of the interconnection layers. The real interconnection present zone is a region in which the real interconnection is provided in the interconnection layer. The prohibited zone is a predetermined region in which no dummy interconnection is provided irrespective of the result of the comparison with the threshold. Examples of the prohibited zone include a region in which the bonding pads are provided, and a region in which an impermissible delay is expected to occur due to the provision of the dummy interconnection.

Subsequently, the thicknesses of the respective interconnection layers to be expected when the interconnection layers are each formed with the real interconnection and the dummy interconnection provided therein in the interconnection pattern thus determined is computed (Step S6). More specifically, it is assumed that the interconnection layers are each formed by performing an interconnection forming step of forming the real interconnection and the dummy interconnection, an insulative film forming step of covering the real interconnection and the dummy interconnection, and the planarization step (e.g., the CMP step). According to this assumption, the thickness (residual thickness) of the interconnection layer to be left after the planarization step is computed by simulation (typically, computer simulation). The computation of the residual thickness is performed for each of the unit regions UR, whereby the in-plane distribution of the residual thickness of the interconnection layer is determined. This computation process is performed for each of the interconnection layers, whereby the in-plane distributions of the residual thickness are provided for the respective interconnection layers.

Next, the residual thicknesses of associated unit regions UR in the respective interconnection layers are summed up. Thus, the overall thickness of the multi-level interconnection structure is determined for each of the unit regions UR. The computation is performed for all the unit regions, whereby the in-plane distribution of the overall thickness of the multi-level interconnection structure to be expected when the dummy interconnection is additionally provided is determined (Step S7).

In turn, the in-plane distribution of the overall thickness of the multi-level interconnection structure is evaluated. More specifically, the variation in the overall thickness is computed as an evaluation value (Step S8). The variation in the overall thickness (evaluation value) may be a difference between the maximum value and the minimum value of the overall thickness.

Then, the threshold is changed (if No in Step S9, go to Step S10), and a process sequence Step S4 to S8 is repeatedly performed. That is, a predetermined number of different thresholds (two or more thresholds) are applied to the in-plane distribution of the overall thickness of the multi-level interconnection structure to be expected when the multi-level interconnection structure is formed without the provision of the dummy interconnection, and sets of the dummy present zone and the dummy absent zone are determined for the respective thresholds (Step S4). Then, the in-plane distributions of the overall thickness of the multi-level interconnection structure to be expected when the multi-level interconnection structure is formed with the provision of the dummy interconnection in the dummy present zone are computed for the respective sets of the dummy present zone and the dummy absent zone (Steps S5, S6, S7), and the evaluation values for the respective in-plane distributions are determined (Step S8).

After the evaluation values for the in-plane distributions of the overall thickness of the multi-level interconnection structure for the respective thresholds are determined (YES in Step S9), the evaluation values are compared with each other. Then, a set of the dummy present zone and the dummy absent zone providing the highest evaluation value (with the smallest variation) is selected (Step S11). That is, interconnection patterns (each including the real interconnection and the dummy interconnection) defined for the respective interconnection layers based on the set of the dummy present zone and the dummy absent zone thus selected are adopted for the production of the semiconductor device 1.

By forming the interconnection layers according to the interconnection patterns thus adopted, the multi-level interconnection structure can be provided, which has an optimized in-plane distribution of the overall thickness. That is, the global step on the upper interconnection layer of the multi-level interconnection structure can be reduced.

FIGS. 6A, 6B and 6C show simulations of the computation of the in-plane distributions of the residual thicknesses of the respective interconnection layers and a simulation of the computation of the in-plane distribution of the overall thickness of the multi-level interconnection structure by way of example. The unit regions UR defined by dividing the surface region of the semiconductor device 1 may be, for example, square regions having a size of 1 μm×1 μm. Where the surface region of the semiconductor device 1 has a size of 1 cm×1 cm, for example, the surface region is divided into 100×100 unit regions UR. For description, FIGS. 6A, 6B and 6C show the results of simulations of the computation of the thicknesses (μm) of the respective interconnection layers in 5×4 unit regions UR out of these unit regions UR. For simplification, description is given to a case in which the multi-level interconnection structure 5 includes only the first interconnection layer 51 and the second interconnection layer 52.

The computation of the in-plane distributions of the residual thicknesses of the first interconnection layer 51 and the second interconnection layer 52 are simulated, whereby the residual thicknesses of the interconnection layers 51, 52 in the respective unit regions UR are determined as shown in FIGS. 6A and 6B. Then, the thicknesses of the first and second interconnection layers 51, 52 in each of the unit regions UR are summed up, whereby the overall thicknesses of the multi-level interconnection structure 5 in the respective unit regions UR are determined as shown in FIG. 6C. As a result, the in-plane distribution of the overall thickness of the multi-level interconnection structure 5 is provided. Further, a difference between the maximum value and the minimum value of the overall thickness is determined as an evaluation value (variation).

Where the first interconnection layer 51 has a thickness of 300 μm and the second interconnection layer 52 has a thickness of 280 μm in an upper left unit region UR in the example shown in FIGS. 6A to 6C, the overall thickness of the multi-level interconnection structure 5 is 580 (=300+280) μm. This is the minimum value of the overall thickness among the 20 unit regions UR. The maximum value of the overall thickness among the 20 unit regions UR is 980 (=500+480) μm in a unit region UR which is located at the fourth line of the second column. Therefore, the evaluation value (variation) is 400 (=980−580) μm. A smaller evaluation value means a higher rating.

FIGS. 7A to 7E are plan views showing exemplary interconnection patterns of the first to fifth interconnection layers 51 to 55 of the multi-level interconnection structure 5. For clarity, the real interconnections 61R to 65R are hatched with oblique lines, and the dummy interconnections 61D to 65D are shown in solid black.

The dummy present zone 11 and the dummy absent zone 12 (other than the zones 11, 13 in FIGS. 7A to 7E) are defined commonly for the first to fifth interconnection layer 51 to 55. The dummy interconnections 61D to 65D are provided in the respective interconnection layers 51 to 55 in the dummy present zone 11 outside the prohibited zone 13 and the dummy absent zone 12. In this example, the dummy interconnections 61D to 65D each include pattern elements each having a rectangular shape such as a square shape. The pattern elements are arranged in a lattice form at predetermined intervals in a row direction and a column direction extending perpendicularly to each other, and provided within the dummy present zone 11 so as not to overlap with the real interconnections 61R to 65R. The prohibited zone 13 includes a region under the bonding pads 8 and a region in which an impermissible delay is expected to occur due to the provision of the dummy interconnection.

Thicker (wider) interconnections 61W to 65W for power source interconnections are provided in peripheral portions of the respective interconnection layers 51 to 55. The thicker interconnections 61W to 65W each have a thickness (width) of, for example, several μm to 10 μm. The other real interconnections {61R to} 65R in the respective interconnection layers each have a thickness (width) of about 0.1 μm to about 0.2 μm. The thicker interconnections 61W to 65W are provided in the dummy absent zone 12 in which the interconnections are arranged at a higher total density in the interconnection layers 51 to 55 as seen in plan.

The plurality of bonding pads 8 are provided in spaced relation along a pair of opposed edges of the semiconductor device 1 in the peripheral portion of the uppermost fifth interconnection layer 55 as seen in plan. The bonding pads 8 are provided in the prohibited zone 13 in the first to fifth interconnection layers 51 to 55.

In general, the peripheral portion of the semiconductor device 1 is a higher interconnection density region, which serves as a dummy absent zone 12. A plurality of such semiconductor devices (chips) 1 are collectively formed on a semiconductor wafer 21 (see FIG. 5), and separated from the semiconductor wafer 21. Thus, the individual semiconductor devices 1 are produced. Where the individual device regions 20 of the semiconductor devices 1 are combined together on the semiconductor wafer 21, the peripheral portions of the individual device regions 20 of the semiconductor devices 1 each have a higher interconnection density because of the thicker interconnections 61W to 56W present in the peripheral portions of the adjacent individual device regions 20 and, hence, each serve as a dummy absent zone 12 in which the multi-level interconnection structure 5 has a greater overall thickness. Since the planarization step (CMP) is performed on the semiconductor wafer 21 with the individual device regions 20 being combined together, the aforementioned zone layout is appropriate. In general, the surface of each of the semiconductor devices (semiconductor chips) 1 has a concaved center portion. Therefore, the dummy present zone 11 is provided in the center portion of the chip, thereby reducing the global step.

FIGS. 8A to 8E show exemplary dummy interconnection layouts according to a comparative example. More specifically, these exemplary dummy interconnection layouts are applicable to the real interconnection patterns shown in FIGS. 7A to 7E. In this comparative example, the in-plane distributions of the residual thickness for the first to fifth interconnection layers 51 to 55 are compared with a threshold to define dummy present zones 111 to 115 and dummy absent zones 121 to 125. Therefore, the dummy present zones 111 to 115 are respectively defined for the first to fifth interconnection layers 51 to 55, and generally different from each other.

In a certain region of the multi-level interconnection structure 5, some of the interconnection layers have a dummy absent zone 121 to 125, and the other interconnection layers have a dummy present zone 111 to 115. In this region, the global step cannot be properly reduced. Particularly, the global step is significantly great on the upper interconnection layer, thereby significantly limiting the process margin.

Figure 8A:
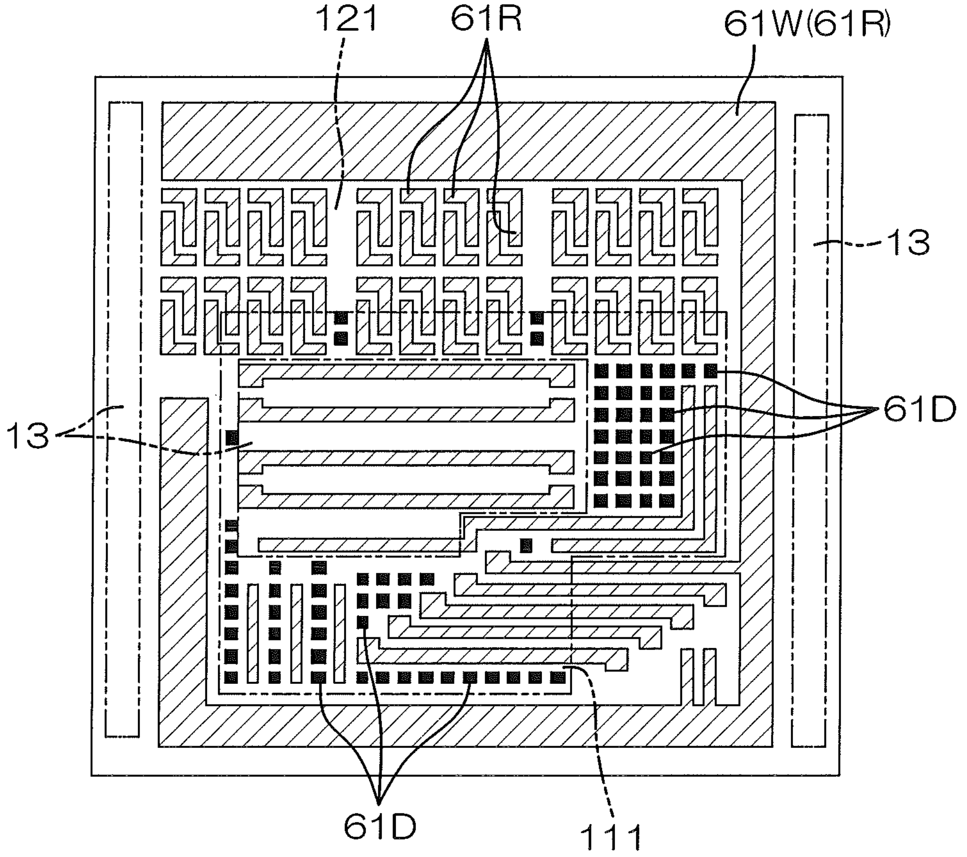
FIG. 8A is a schematic plan view showing an exemplary dummy interconnection layout (of a first interconnection layer) according to a comparative example.
Figure 8B:
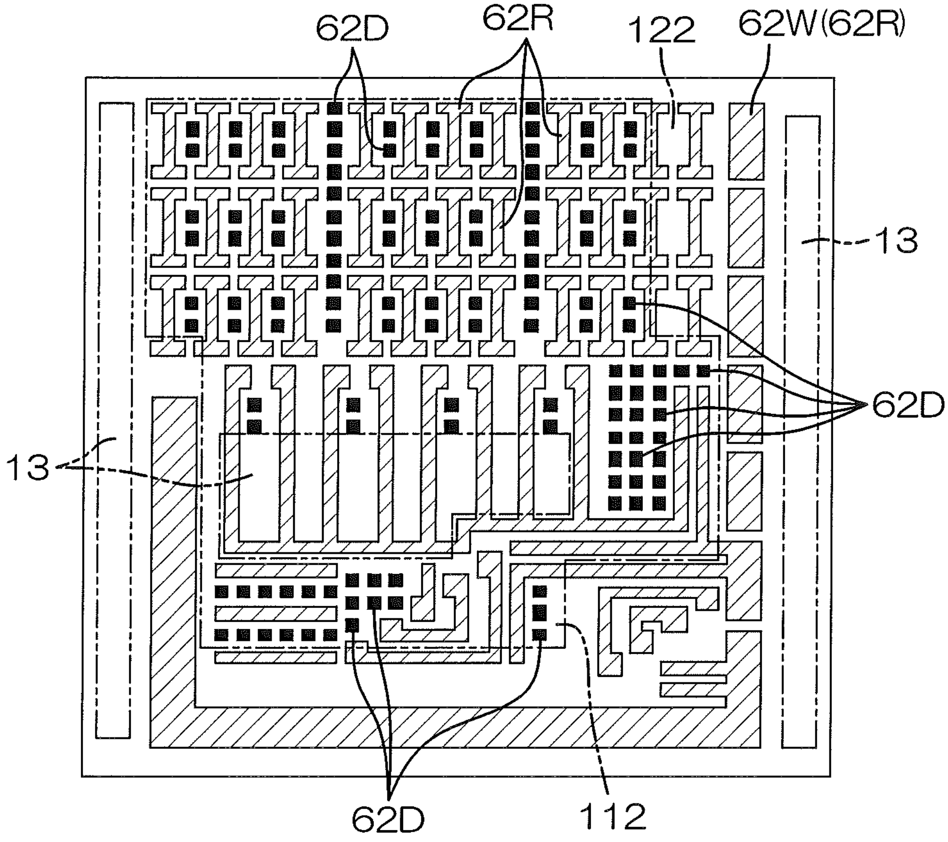
FIG. 8B is a schematic plan view showing an exemplary dummy interconnection layout (of a second interconnection layer) according to the comparative example.
Figure 8C:
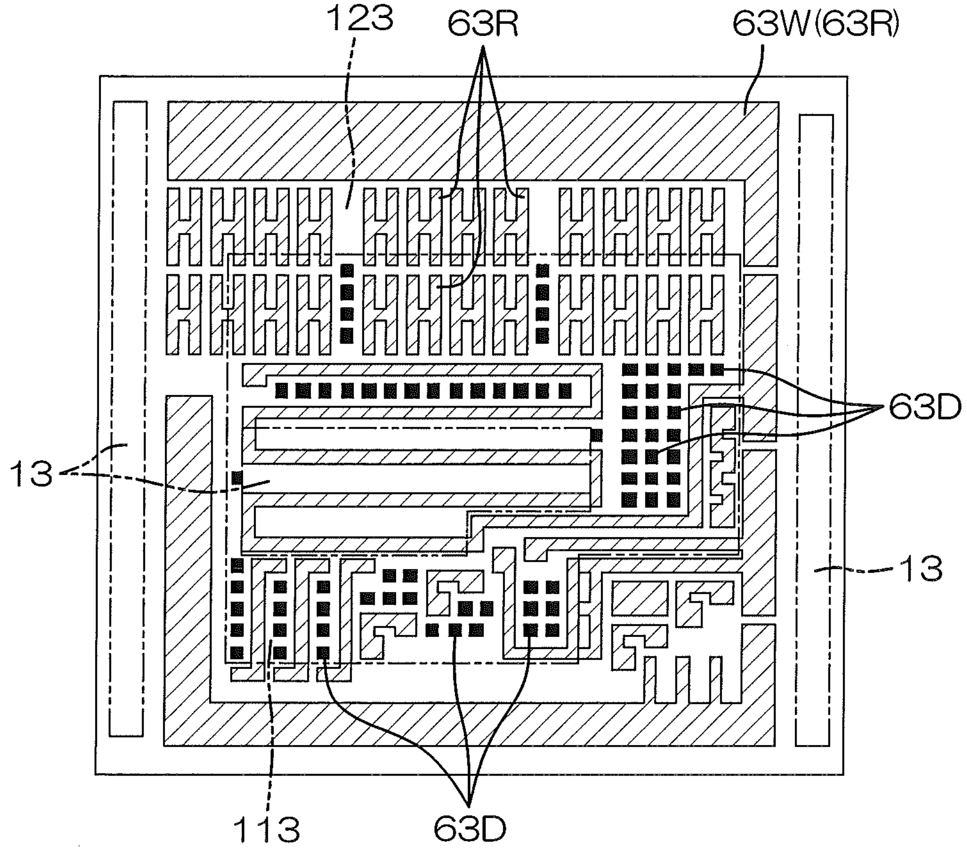
FIG. 8C is a schematic plan view showing an exemplary dummy interconnection layout (of a third interconnection layer) according to the comparative example.
Figure 8D:
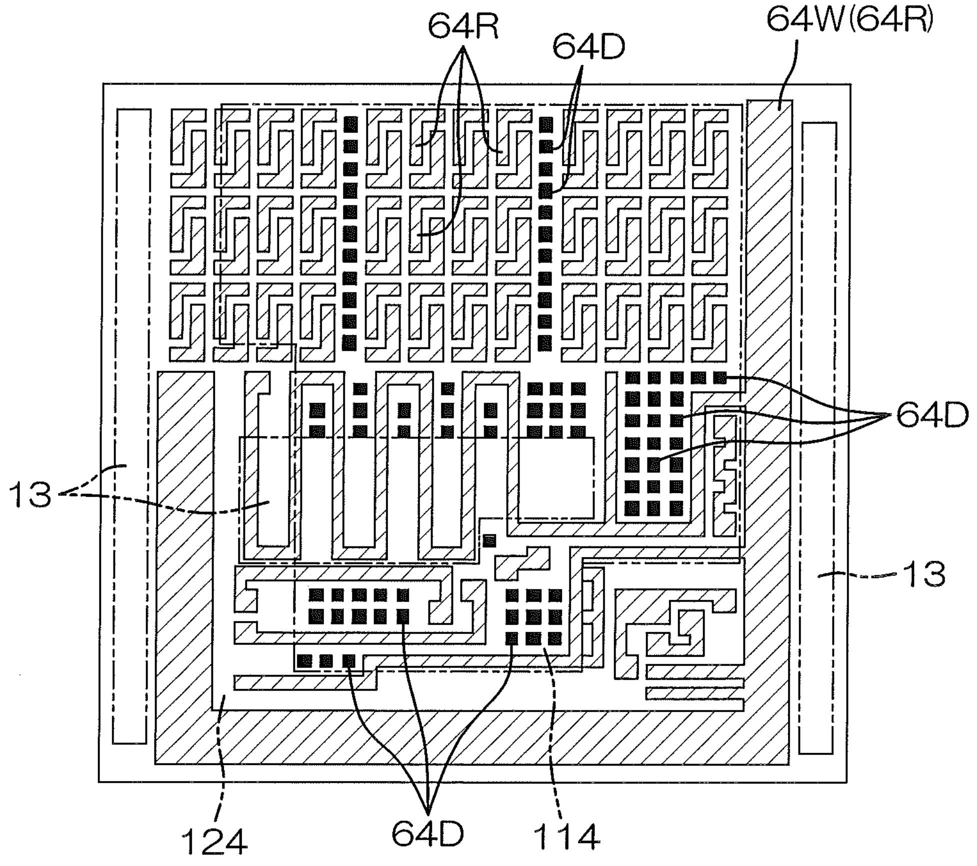
FIG. 8D is a schematic plan view showing an exemplary dummy interconnection layout (of a fourth interconnection layer) according to the comparative example.
Figure 8E:
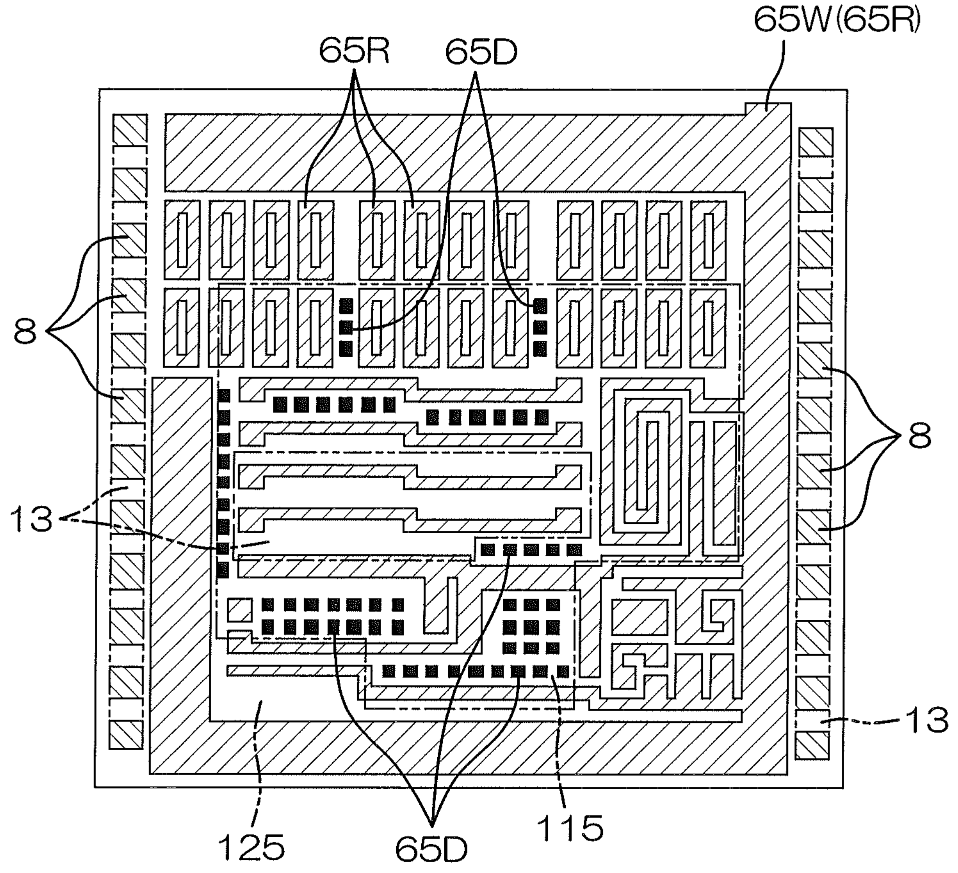
FIG. 8E is a schematic plan view showing an exemplary dummy interconnection layout (of a fifth interconnection layer) according to the comparative example.

As shown in FIGS. 8A to 8B {8E}, for example, thicker interconnections 61W, 63W, 65W extend laterally along upper side edges of the first interconnection layer 51 (FIG. 8A), the third interconnection layer 53 (FIG. 8C) and the fifth interconnection layer 55 (FIG. 8E). In this region, the first, third and fifth interconnection layers 51, 53, 55 respectively have dummy absent zones 121, 123, 125, and the second and fourth interconnection layers 52, 54 respectively have dummy present zones 112, 114, in which the dummy interconnections 62D, 64D are respectively provided. In this region, the dummy interconnections 62D, 64D are respectively provided in the second and fourth interconnection layers 52, 54, though the first, third and fifth interconnection layers 51, 53, 55 each have a greater residual thickness due to the provision of the thicker interconnections 61W, 63W, 65W. As a result, the provision of the dummy interconnections 62D, 64D increases the global step on the overall multi-level interconnection structure 5.

In this embodiment, as described above, the in-plane distribution of the overall thickness of the multi-level interconnection structure 5 to be expected when the multi-level interconnection structure 5 is formed by stacking the interconnection layers 51 to 55 without the provision of the dummy interconnections 61D to 65D is computed. In the production process for the actual semiconductor device 1, the step of forming each of the interconnection layers 51 to 55 includes the interconnection forming step of forming the real interconnection 61R to 65R and the dummy interconnection

61D to 65D, the insulative film forming step of forming the insulative film 71 to 75 covering the real interconnection 61R to 65R and the dummy interconnection 61D to 65D, and the planarization step of planarizing the surface of the insulative film 71 to 75. It is assumed that the multi-level interconnection structure 5 is formed without the provision of the dummy interconnections 61D to 65D in these process steps. Then, the in-plane distribution of the overall thickness is computed based on this assumption. That is, the in-plane distribution of the overall thickness of the multi-level interconnection structure 5 to be expected when the multi-level interconnection structure 5 is formed without the provision of the dummy interconnections 61D to 65D is computed. The in-plane distribution indicates the global step on the surface of the multi-level interconnection structure 5 to be formed without the provision of the dummy interconnections 61D to 65D.

Based on the in-plane distribution thus computed, the dummy present zone 11 in which the dummy interconnections 61D to 65D are to be provided and the dummy absent zone 12 in which no dummy interconnections 61D to 65D are to be provided are defined. In the interconnection forming step of forming each of the interconnection layers 51 to 55, the dummy interconnections 61D to 65D are provided in the dummy present zone 11, and no dummy interconnections 61D to 65D are provided in the dummy absent zone 12 according to the layout of these zones. That is, the dummy present zone 11 and the dummy absent zone 12 are defined commonly for the interconnection layers 51 to 55 of the multi-level interconnection structure 5, and the dummy interconnections 61D to 65D are provided in the respective interconnection layers 51 to 55 only in the dummy present zone 11.

Since the dummy present zone 11 and the dummy absent zone 12 are defined based on the overall thickness distribution of the multi-level interconnection structure 5, there is no possibility that global steps occurring on the respective interconnection layers 51 to 55 are accumulated. Therefore, the global step on the surface of an upper one of the interconnection layers 51 to 55 of the multi-level interconnection structure 5 can be reduced. In general, a lower one of the interconnection layers 51 to 55 of the multi-level interconnection structure 5 has a smaller global step, and an upper one of the interconnection layers 51 to 55 has a greater global step. Therefore, if it is possible to reduce the global step on the upper interconnection layer, the global steps on the respective layers of the multi-level interconnection structure 5 are consequently reduced. This makes it possible to accurately perform the photolithography process on each of the interconnection layers 51 to 55.

In this embodiment, the dummy present zone 11 and the dummy absent zone 12 are defined by applying the threshold to the result of the computation of the in-plane distribution without the provision of the dummy interconnections 61D to 65D. Thus, the dummy present zone in which the dummy interconnections are to be provided can be defined by a simple method.

In this embodiment, the plurality of thresholds are applied to the result of the computation of the in-plane distribution without the provision of the dummy interconnections 61D to 65D. Accordingly, plural sets of the dummy present zone and the dummy absent zone are defined for the respective thresholds. The in-plane distributions of the overall thickness of the multi-level interconnection structure 5 to be expected when the multi-level interconnection structure 5 is formed with the dummy interconnections provided in the dummy present zone outside the dummy absent zone are computed for the respective sets of the dummy present zone and the dummy absent zone. The in-plane distributions thus computed are evaluated, and one of the sets of the dummy present zone and the dummy absent zone is selected. That is, the optimum one of the thresholds is found based on the evaluation of the in-plane distributions. Thus, the optimum threshold can be applied, so that the dummy present zone 11 and the dummy absent zone 12 can be properly defined. As a result, a global step on an upper interconnection layer of the multi-level interconnection structure 5 can be further reduced.

While the embodiment of the present invention has thus been described, the invention may be embodied in other ways. In the embodiment described above, the dummy interconnections 61D to 65D each include the dummy interconnection pattern including a plurality of pattern elements each having a predetermined shape and a predetermined size and regularly arranged. However, the dummy interconnections may each include plural types of pattern elements having different shapes and different sizes. Further, the pattern elements of the dummy interconnection pattern are not necessarily required to be arranged at a constant interval, but may be arranged at different intervals (i.e., at different densities). The pattern elements are not necessarily required to be arranged in the two orthogonal directions in a matrix array, but may be arranged in spaced relation in two directions crossing at an angle other than a right angle. Further, it is not necessarily required to employ the same dummy interconnection pattern for the respective interconnection layers, but the interconnection layers may employ different dummy interconnection patterns having different dummy interconnection distances.

In the embodiment described above, the unit regions UR are used commonly for the computation of the in-plane distribution without the provision of the dummy interconnection and for the computation of the in-plane distribution with the provision of the dummy interconnection. The unit regions to be used for these computations may be different in at least one of the shape and the size.

The distance between the real interconnection and the dummy interconnection may be the same for all the interconnection layers, or may vary from one interconnection layer to another. The distance is preferably minimized such that an interconnect capacitance occurring between the real interconnection and the dummy interconnection is negligible.

The present application corresponds to Japanese Patent Application No. 2013-118146 filed in the Japan Patent Office on Jun. 4, 2013, and the entire disclosure of the application is incorporated herein by reference.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A production method for a semiconductor device having a multi-level interconnection structure including a plurality of interconnection layers stacked one on another on a semiconductor substrate, the method comprising:

an interconnection layer forming step of forming each of the interconnection layers of the multi-level interconnection structure, the interconnection layer forming step including an interconnection forming step of forming a real interconnection and a dummy interconnection, an insulative film forming step of forming an insulative film covering the real interconnection and the dummy interconnection, and a planarization step of planarizing a surface of the insulative film;

a dummy-absent in-plane distribution computing step of computing an in-plane distribution of an overall thickness of the multi-level interconnection structure to be expected when the interconnection layers are each formed by performing the interconnection forming step, the insulative film forming step and the planarization step without forming the dummy interconnection; and a zone defining step of, based on the in-plane distribution of the overall thickness, defining a dummy present zone in which the dummy interconnection is to be provided and a dummy absent zone in which no dummy interconnection is to be provided;

wherein the interconnection forming step includes the step of forming the dummy interconnection in the defined dummy present zone outside the defined dummy absent zone.

2. The semiconductor device production method according to claim 1, wherein the zone defining step includes the step of defining the dummy present zone and the dummy absent zone by applying a threshold to the in-plane distribution of the overall thickness computed in the dummy-absent in-plane distribution computing step.

3. The semiconductor device production method according to claim 1, wherein the zone defining step includes:

a multi-threshold zone set defining step of applying a plurality of different thresholds to the in-plane distribution of the overall thickness computed in the dummy-absent in-plane distribution computing step to define plural sets of the dummy present zone and the dummy absent zone for the respective thresholds;

a dummy-present in-plane distribution computing step of, for the respective sets of the dummy present zone and the dummy absent zone, computing in-plane distributions of the overall thickness of the multi-level interconnection structure to be expected when the interconnection layers are each formed by performing the interconnection forming step, the insulative film forming step and the planarization step with the dummy interconnection provided in the dummy present zone outside the dummy absent zone; and a zone set selecting step of selecting one of the plural sets of the dummy present zone and the dummy absent zone by evaluating the in-plane distributions for the respective sets of the dummy present zone and the dummy absent zone.

4. The semiconductor device production method according to claim 1, wherein the dummy-absent in-plane distribution computing step includes the step of computing overall thicknesses of the multi-level interconnection structure in a plurality of unit regions defined as each having a predetermined shape and a predetermined size by dividing a major surface region of the semiconductor substrate.

5. A semiconductor device, comprising:

a semiconductor substrate; and a multi-level interconnection structure that is provided on the semiconductor substrate and that has a plurality of interconnection layers stacked one on another, each interconnection layer including a real interconnection and a dummy interconnection covered with an insulative film;

wherein the dummy interconnection is provided in a dummy present zone defined commonly for the respective interconnection layers outside a dummy absent zone defined commonly for the respective interconnection layers;

wherein the plurality of interconnection layers includes a first interconnection layer including a first real interconnection, a second interconnection layer stacked on the first interconnection layer and including an overlapping dummy interconnection that overlaps the first real interconnection when viewed in plan, and a third interconnection layer stacked on the second interconnection layer and including a second real interconnection that overlaps the overlapping dummy interconnection when viewed in plan.

6. The semiconductor device according to claim 5, wherein the real interconnection is provided at a higher density in a part of the dummy present zone than in a part of the dummy absent zone in at least one of the interconnection layers.

7. The semiconductor device according to claim 5, wherein the density of the real interconnection is lower in the dummy present zone than in the dummy absent zone in the overall multi-level interconnection structure including the plurality of interconnection layers.

8. The semiconductor device according to claim 5, wherein at least one of the dummy interconnection and the real interconnection is provided in the dummy present zone in each of the interconnection layers, and wherein no dummy interconnection is provided in the dummy absent zone in any of the interconnection layers.

9. The semiconductor device according to claim 8, wherein the real interconnection or none of the dummy interconnection and the real interconnection is provided in the dummy absent zone in each of the interconnection layers.

10. The semiconductor device according to claim 5, wherein every portion of the semiconductor device as seen in plan falls within one of the dummy present zone, the dummy absent zone, and a prohibited zone in which the provision of the dummy interconnection is prohibited.

11. The semiconductor device according to claim 5, wherein the dummy present zone is surrounded by the dummy absent zone.

12. The semiconductor device according to claim 11, wherein the dummy absent zone includes at least a looped region extending along peripheral edges of the semiconductor device as seen in plan.

* * * * *